(12) United States Patent
Chen et al.

(10) Patent No.: US 10,923,554 B2
(45) Date of Patent: Feb. 16, 2021

(54) DISPLAY PANEL AND DISPLAY DEVICE

(71) Applicant: Wuhan China Star Optoelectronics Semiconductor Display Technology Co., Ltd., Wuhan (CN)

(72) Inventors: Caiqin Chen, Wuhan (CN); Shaobo Wang, Wuhan (CN); Yiyi Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 29 days.

(21) Appl. No.: 16/493,307

(22) PCT Filed: Apr. 11, 2019

(86) PCT No.: PCT/CN2019/082247
§ 371 (c)(1),
(2) Date: Sep. 12, 2019

(87) PCT Pub. No.: WO2020/124884
PCT Pub. Date: Jun. 25, 2020

(65) Prior Publication Data
US 2020/0335569 A1    Oct. 22, 2020

(51) Int. Cl.
*H01L 27/14* (2006.01)
*H01L 27/32* (2006.01)

(52) U.S. Cl.
CPC .................. *H01L 27/3276* (2013.01)

(58) Field of Classification Search
CPC ............. H01L 27/3276; H01L 27/3297; H01L 2027/11875; H01L 2027/11883; H01L 2027/11885
USPC ..................................................... 257/59, 72
See application file for complete search history.

(56) References Cited

U.S. PATENT DOCUMENTS

| 9,660,011 | B2 | 5/2017 | Kim et al. |
| 2016/0307938 | A1 | 10/2016 | Jin |
| 2017/0068368 | A1* | 3/2017 | Hsiao ................... G06F 3/0445 |
| 2019/0165004 | A1 | 5/2019 | Lou et al. |

FOREIGN PATENT DOCUMENTS

| CN | 102122092 | 7/2011 |
| CN | 104465690 | 3/2015 |
| CN | 104793417 | 7/2015 |
| CN | 107978610 | 5/2018 |
| CN | 108039148 | 5/2018 |
| CN | 108288455 | 7/2018 |

* cited by examiner

*Primary Examiner* — Tan N Tran

(57) ABSTRACT

A display panel includes a substrate, a first metal layer arranged on the substrate, a first insulating layer disposed on the first metal layer, a second metal layer disposed on the first insulating layer, and a pixel unit. The first metal layer includes a first metal line and a second metal line. The first metal layer is spaced apart along a first direction. The second metal line is spaced apart along a second direction. The first metal line and the second metal line are connected at an intersection. The second metal layer includes a peripheral metal line. The peripheral metal line is electrically connected to the first metal line and the second metal line. The first metal line and the second metal line are connected to the pixel unit. The first metal line and the second metal line supply the pixel unit with a signal voltage.

14 Claims, 3 Drawing Sheets

DISPLAY PANEL AND DISPLAY DEVICE

RELATED APPLICATIONS

This application is a National Phase of PCT Patent Application No. PCT/CN2019/082247 having International filing date of Apr. 11, 2019, which claims the benefit of priority of Chinese Patent Application No. 201811546762.6 filed on Dec. 18, 2018. The contents of the above applications are all incorporated by reference as if fully set forth herein in their entirety.

FIELD AND BACKGROUND OF THE INVENTION

The present disclosure relates to the field of display panel, and more particularly, to a display panel and a display device.

Owing to some merits of self-luminescence, high contrast, wide viewing angle, low power consumption, and flexibility, an organic light-emitting diode (OLED) is widely applied on the market. Besides, a flexible OLED panels has been gradually occupied the market owing to the features such as flexibility and compactness.

For a common display panel with pixel structure, a voltage is supplied through a Vi signal routing, and there are two functions, which has two functions. One of the functions is to supply a reset signal before the OLED device at a display phase. The other function is to supply a threshold voltage to a driving thin film transistor (TFT) so that the pixel can operate normally.

Two rows of Vi signal routings arranged in parallel for the Vi signal routing structure of the related art. However, when the display panel is actually working, there is a certain deviation from the Vi voltage level delivered to each pixel due to some factors such as voltage drop, which affects the uniformity of the display of the display panel. Thus, it is necessary to propose a new display panel and a new display device to deal with the problems of the related art.

SUMMARY OF THE INVENTION

The present disclosure proposes a display panel and a display device to deal with a problem that a signal voltage imposed on devices with different pixels is deviated during the receiving process, thereby affecting the displaying uniformity of the display panel.

According to a first aspect of the present disclosure, a display panel includes a substrate, a first metal layer arranged on the substrate, a first insulating layer disposed on the first metal layer, a second metal layer disposed on the first insulating layer, and a pixel unit. The first metal layer includes a first metal line and a second metal line. The first metal layer is spaced apart along a first direction. The second metal line is spaced apart along a second direction. The first metal line and the second metal line are connected at an intersection. The second metal layer includes a peripheral metal line. The peripheral metal line is electrically connected to the first metal line and the second metal line. The first metal line and the second metal line are connected to the pixel unit. The first metal line and the second metal line supply the pixel unit with a signal voltage.

According to one embodiment of the present disclosure, the first direction is perpendicular to the second direction. The first metal line and the second metal line form a mesh-like metal line.

According to one embodiment of the present disclosure, a first hole is disposed in the first insulating layer. The first metal layer is electrically connected to the second metal layer through the first hole.

According to one embodiment of the present disclosure, the first metal line and the second metal line are arranged in a gap between the adjacent pixel units.

According to one embodiment of the present disclosure, the first metal layer further comprises a signal routing; one or more of the first metal line and the second metal line are connected with the signal routing at the intersection with a bridge.

According to one embodiment of the present disclosure, two terminals of the bridge are connected to a second hole of the first insulating layer, respectively. The second metal layer is electrically connected to the first metal line and the second metal line through the second hole.

According to one embodiment of the present disclosure, the display panel comprises a display area and a non-display area. The non-display area is disposed at a periphery of the display area. The first metal layer is located in the display area. The peripheral metal line is located in the non-display area.

According to one embodiment of the present disclosure, the peripheral metal line surrounds three or more sides of the display area.

According to one embodiment of the present disclosure, the first metal layer is a second gate metal layer; the first insulating layer is a second gate insulating layer. The second metal layer is a source and drain metal layer.

According to one embodiment of the present disclosure, the first direction is not parallel to the second direction.

According to a second aspect of the present disclosure, a display device includes a display panel and a frame. The display panel includes a substrate, a first metal layer arranged on the substrate, a first insulating layer disposed on the first metal layer, a second metal layer disposed on the first insulating layer, and a pixel unit. The first metal layer includes a first metal line and a second metal line. The first metal layer is spaced apart along a first direction. The second metal line is spaced apart along a second direction. The first metal line and the second metal line are connected at an intersection. The second metal layer includes a peripheral metal line. The peripheral metal line is electrically connected to the first metal line and the second metal line. The first metal line and the second metal line are connected to the pixel unit. The first metal line and the second metal line supply the pixel unit with a signal voltage.

According to one embodiment of the present disclosure, the first direction is perpendicular to the second direction. The first metal line and the second metal line form a mesh-like metal line.

According to one embodiment of the present disclosure, a first hole is disposed in the first insulating layer. The first metal layer is electrically connected to the second metal layer through the first hole.

According to one embodiment of the present disclosure, the first metal line and the second metal line are arranged in a gap between the adjacent pixel units.

According to one embodiment of the present disclosure, the first metal layer further comprises a signal routing; one or more of the first metal line and the second metal line are connected with the signal routing at the intersection with a bridge.

According to one embodiment of the present disclosure, two terminals of the bridge are connected to a second hole of the first insulating layer, respectively. The second metal layer is electrically connected to the first metal line and the second metal line through the second hole.

According to one embodiment of the present disclosure, the display panel comprises a display area and a non-display area. The non-display area is disposed at a periphery of the display area. The first metal layer is located in the display area. The peripheral metal line is located in the non-display area.

According to one embodiment of the present disclosure, the peripheral metal line surrounds three or more sides of the display area.

According to one embodiment of the present disclosure, the first metal layer is a second gate metal layer; the first insulating layer is a second gate insulating layer. The second metal layer is a source and drain metal layer.

According to one embodiment of the present disclosure, the first direction is not parallel to the second direction.

The present disclosure proposes a display panel and a display device where signal voltage routings of the pixel unit are alternately distributed in the same film layer, thereby avoiding the signal voltage receiving of the pixel unit from being deviated due to the uneven distribution of the signal voltage lines and improving the quality of the display panel.

BRIEF DESCRIPTION OF THE SEVERAL VIEWS OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF SPECIFIC EMBODIMENTS OF THE INVENTION

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The present disclosure is directed to a problem that a signal voltage on different pixel units are deviated during the receiving process, thereby affecting the display uniformity of the display panel and proposes a new display panel and a new display device. According to the present embodiment, the drawback of the related art can be well dealt with.

The present disclosure is further described below in conjunction with the accompanying pictures and specific embodiments.

Figure 1:
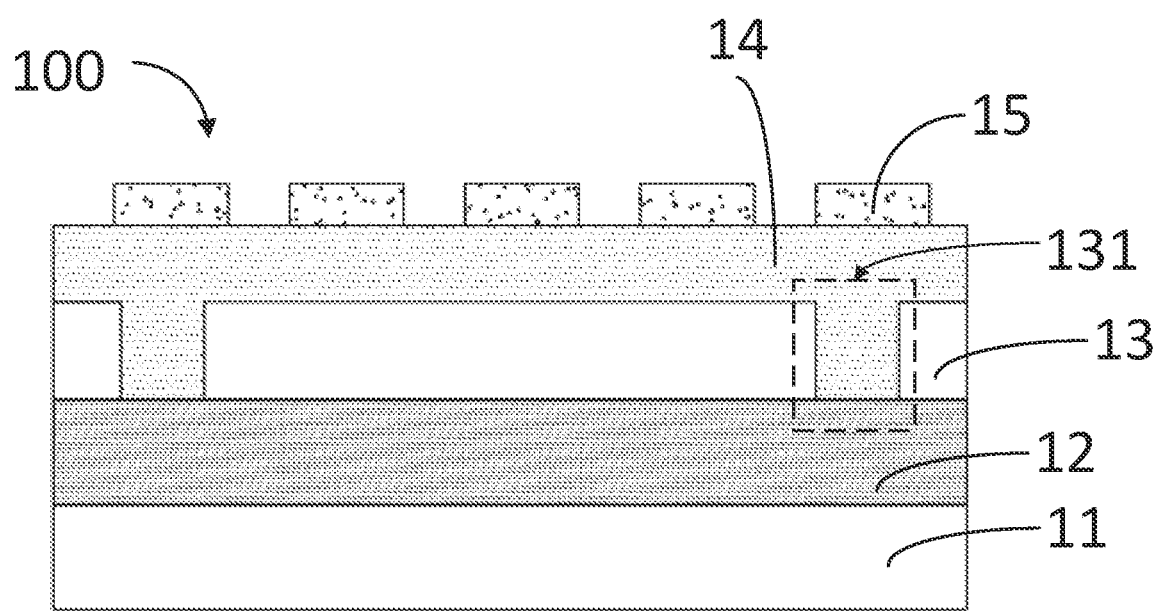
FIG. 1 illustrates a schematic diagram of a film layer structure of a display panel according to another embodiment of the present disclosure.

Please refer to FIG. 1 illustrating a schematic diagram of a film layer structure of a display panel according to another embodiment of the present disclosure.

Figure 2:
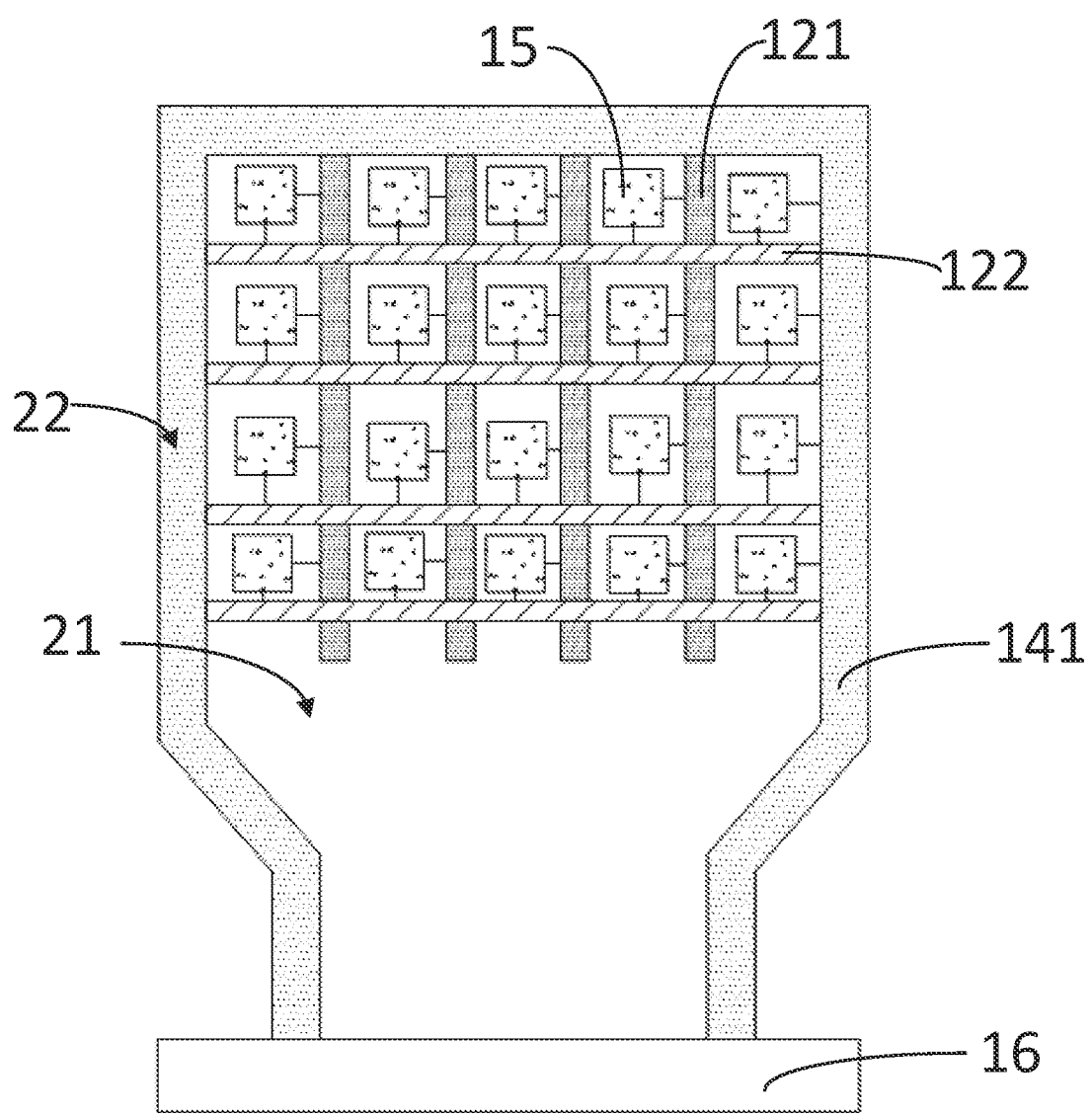
FIG. 2 illustrates a top view of a display panel according to another embodiment of the present disclosure.

Please refer to FIG. 2 illustrating a top view of a display panel according to another embodiment of the present disclosure.

The display panel 100 includes a substrate 1, a first metal layer 12, a first insulating layer 13, and a pixel unit 15. The first metal layer 12 is disposed on the substrate 1. The first insulating layer 13 and the pixel unit 15 are disposed on the first metal layer 12.

The substrate 1 includes a sinker, a light shielding plate, a buffer layer, an active layer, a first gate insulating layer, a gate metal layer, a second gate insulating layer, etc.

The first metal layer 12 includes a first metal line 121 and a second metal line 122. The first metal layer 12 is spaced apart along a first direction. The second metal line 122 is spaced apart along a second direction. The first metal line 121 and the second metal line 122 are connected at an intersection.

In another embodiment, the first direction is not parallel to the second direction.

The first metal layer 12 is disposed on a surface of the second gate insulating layer. In other words, the first metal layer 12 may be a second gate metal layer which is commonly referred to in the display panel 100.

Material for the first metal layer 12 includes, but is not limited to, molybdenum.

The first metal lines 121 are evenly spaced in a plane where the first metal lines 121 are arranged.

The second metal lines 122 are evenly spaced in a plane where the second metal lines 122 are arranged.

Since the first metal line 121 and the second metal line 122 are evenly spaced in the planes where the first metal lines 121 and the second metal lines 122 are respectively arranged, each of the pixel units 15 in the display panel 100 can receive a constant signal voltage, thereby improving the quality of the display panel 100.

The first insulating layer 13 that is disposed on the first metal layer 12 is the second gate insulating layer and configured to avoid a short cut between the first metal layer 12 and the second metal layer 14.

The second metal layer 14 is disposed on the first insulating layer 13. The second metal layer 14 includes a peripheral metal line 141. The peripheral metal line 141 is electrically connected to the first metal line 121 and the second metal line 122, respectively.

The peripheral metal line 141 is electrically connected to the driving circuit 16 on the display panel 100 and connected to the first metal line 121 and the second metal line 122. Therefore, the peripheral metal line 141 can supply the first metal line 121 and the second metal line 122 with a signal voltage.

The pixel unit 15 is distributed in an array on the substrate 1 and configured to emit light, which is one of the functions of the display panel 100. The first metal line 121 and the second metal line 122 supply a stable signal voltage.

The first metal line 121 and the second metal line 122 are connected to the pixel unit 15. The first metal line 121 and the second metal line 122 supply the pixel unit 15 with a signal voltage.

The distributive density of the first metal line 121 and the second metal line 122 can be designed according to actual needs, so there is no limitation for the metal lines provided by the present disclosure.

The first direction is perpendicular to the second direction. The first metal line 121 and the second metal line 122 form a mesh-like metal line.

A first hole 131 is disposed in the first insulating layer 13. The first metal layer 12 is electrically connected to the second metal layer 14 through the first hole 131.

The peripheral metal line 141 is disposed on the periphery of the first metal layer 12. The first hole 131 is disposed at a boundary of the peripheral metal line 141, the first metal line 121, and the second metal line 122 to prevent the influence of the peripheral metal line 141 on other components of the display panel 100.

The first metal line 121 and the second metal line 122 are arranged in a gap between the adjacent pixel units 15. Further, the first metal line 121 and the second metal line 122 do not affect the arrangement of the pixel unit 15.

Figure 3:
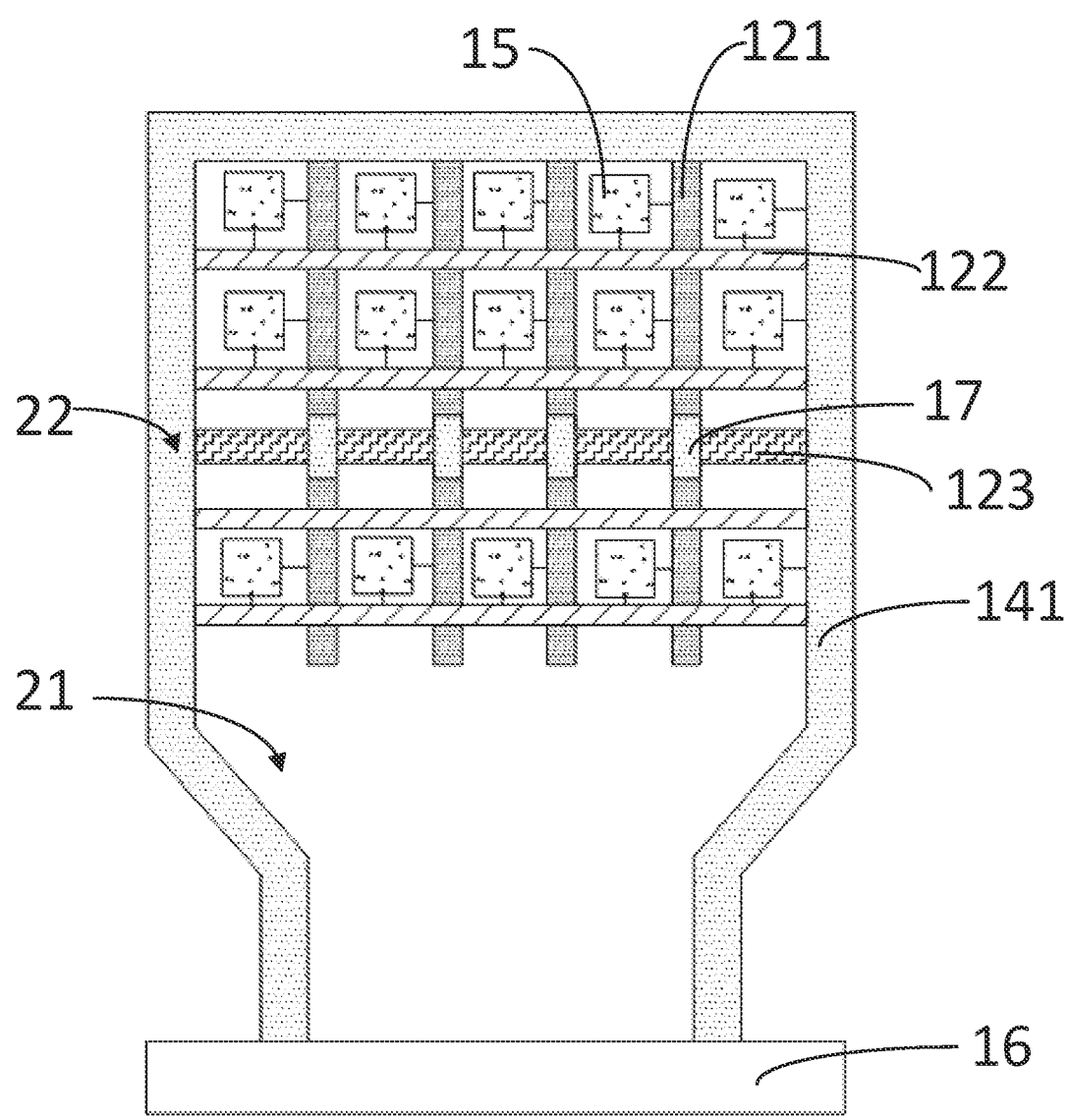
FIG. 3 illustrates a top view of a display panel 100 according to another embodiment of the present disclosure.

Please refer to FIG. 3 illustrating a top view of a display panel 100 according to another embodiment of the present disclosure.

The first metal layer 12 further includes a signal routing 123. The first metal line 121 crosses over the signal routing 123 at the intersection through a bridge 17. The signal routing 123 refers to a routing other than the first metal line 121 and the second metal line 122.

Two terminals of the bridge 17 are connected to the second hole of the first insulating layer 13, respectively. The second metal layer 14 is electrically connected to the first metal line 121 and the second metal line 122 through the second hole.

The display panel 100 includes a display area 21 and a non-display area 22. The non-display area 22 is disposed at the periphery of the display area 21.

The first metal layer 12 is located in the display area 21. The peripheral metal line 141 is located in the non-display area 22.

The peripheral metal line 141 surrounds three or more sides of the display area 21. When the peripheral metal line 141 surrounds the three sides of the display area 21, the driving circuit 16 is located on the last side of the display area 21. Both terminals of the peripheral metal line 141 are electrically connected to the driving circuit 16.

The first metal layer 12 is a second gate metal layer. The first insulating layer 13 is a second gate insulating layer. The second metal layer 14 is a source and drain metal layer.

The first metal line 121, the second metal line 122, and the peripheral metal line 141 are all the Vi signal routings 123 in the pixel unit 15. The Vi signal routing 123 includes two functions. One of the functions is to supply a reset signal before the pixel unit 15 at a display phase. The other function is to supply a threshold voltage to a driving thin film transistor (TFT) so that the circuit of the pixel unit 15 can operate normally.

Further, the present disclosure proposes a display device. The display device includes a display panel 100 and a frame. The display panel 100 includes a substrate 1, a first metal layer 12, a first insulating layer 13, a second metal layer 14, and a pixel unit 15. The first metal layer 12 is disposed on the substrate 1. The first insulating layer 13 is disposed on the first metal layer 12. The second metal layer 14 and the pixel unit 15 are both disposed on the first insulating layer 13.

The first metal layer 12 includes a first metal line 121 and a second metal line 122. The first metal layer 12 is spaced apart along a first direction. The second metal line 122 is spaced apart along a second direction. The first metal line 121 and the second metal line 122 are connected at an intersection.

The second metal layer 14 includes a peripheral metal line 141. The peripheral metal line 141 is electrically connected to the first metal line 121 and the second metal line 122, respectively.

The first metal line 121 and the second metal line 122 are connected to the pixel unit 15 and supply each of the pixel units 15 with a signal voltage.

Material for the first metal layer 12 includes, but is not limited to, molybdenum.

The first metal lines 121 are evenly spaced in a plane where the first metal lines 121 are arranged.

The second metal line 122 is evenly spaced in a plane where the second metal line 122 is arranged.

Since the first metal line 121 and the second metal line 122 are evenly spaced in the planes where the first metal lines 121 and the second metal lines 122 are respectively arranged, each of the pixel units 15 in the display panel 100 can receive a constant signal voltage, thereby improving the quality of the display panel 100.

The first insulating layer 13 is the second gate insulating layer and configured to avoid a short cut between the first metal layer 12 and the second metal layer 14.

The second metal layer 14 is disposed on the first insulating layer 13. The second metal layer 14 includes a peripheral metal line 141. The peripheral metal line 141 is electrically connected to the first metal line 121 and the second metal line 122, respectively.

The peripheral metal line 141 is electrically connected to the driving circuit 16 on the display panel 100 and connected to the first metal line 121 and the second metal line 122. Therefore, the peripheral metal line 141 can supply the first metal line 121 and the second metal line 122 with a signal voltage.

The pixel unit 15 is distributed in an array on the substrate 1 and configured to emit light, which is one of the functions of the display panel 100. The first metal line 121 and the second metal line 122 supply a stable signal voltage.

The first metal line 121 and the second metal line 122 are connected to the pixel unit 15. The first metal line 121 and the second metal line 122 supply the pixel unit 15 with a signal voltage.

The distributive density of the first metal line 121 and the second metal line 122 can be designed according to actual needs, so there is no limitation for the metal lines provided by the present disclosure.

The first direction is perpendicular to the second direction. The first metal line 121 and the second metal line 122 form a mesh-like metal line.

A first hole 131 is disposed in the first insulating layer 13. The first metal layer 12 is electrically connected to the second metal layer 14 through the first hole 131.

The peripheral metal line 141 is disposed on the periphery of the first metal layer 12. The first hole 131 is disposed at a boundary of the peripheral metal line 141, the first metal line 121, and the second metal line 122 to prevent the influence of the peripheral metal line 141 on other components of the display panel 100.

The first metal line 121 and the second metal line 122 are arranged in a gap between the adjacent pixel units 15. Further, the first metal line 121 and the second metal line 122 do not affect the arrangement of the pixel unit 15.

The first metal layer 12 further includes a signal routing 123. The first metal line 121 crosses over the signal routing 123 at the intersection through a bridge 17. The signal routing 123 refers to a routing other than the first metal line 121 and the second metal line 122.

Two terminals of the bridge are connected to the second hole of the first insulating layer 13, respectively. The second metal layer 14 is electrically connected to the first metal line 121 and the second metal line 122 through the second hole.

The display panel 100 includes a display area 21 and a non-display area 22. The non-display area 22 is disposed at the periphery of the display area 21.

The peripheral metal line 141 surrounds three or more sides of the display area 21. While the peripheral metal line 141 surrounds the three sides of the display area 21, the driving circuit 16 is located on the last side of the display area 21. Both terminals of the peripheral metal line 141 are electrically connected to the driving circuit 16.

In other words, the first metal layer 12 is a second gate metal layer. The first insulating layer 13 is a second gate insulating layer. The second metal layer 14 is a source and drain metal layer.

The present disclosure proposes a display panel and a display device where signal voltage routings of the pixel unit are alternately distributed in the same film layer, thereby avoiding the signal voltage receiving of the pixel unit from being deviated due to the uneven distribution of the signal voltage lines and improving the quality of the display panel.

While the present invention has been described in connection with what is considered the most practical and preferred embodiments, it is understood that this invention is not limited to the disclosed embodiments but is intended to frame various arrangements made without departing from the scope of the broadest interpretation of the appended claims.

What is claimed is:

1. A display panel, comprising:
   a substrate;
   a first metal layer, arranged on the substrate, wherein the first metal layer comprises a first metal line and a second metal line; the first metal layer is spaced apart along a first direction; the second metal line is spaced apart along a second direction; the first metal line and the second metal line are connected at an intersection;
   a first insulating layer, disposed on the first metal layer;
   a second metal layer, disposed on the first insulating layer, wherein the second metal layer comprises a peripheral metal line electrically connected to the first metal line and the second metal line; and
   a pixel unit;
   wherein the first metal line and the second metal line are connected to the pixel unit and configured to supply the pixel unit with a signal voltage; wherein the first metal layer further comprises a signal routing; one or more of the first metal line and the second metal line are connected with the signal routing at the intersection with a bridge; wherein two terminals of the bridge are connected to a second hole of the first insulating layer, respectively; the second metal layer is electrically connected to the first metal line and the second metal line through the second hole; and wherein the first metal layer is a second gate metal layer; the first insulating layer is a second gate insulating layer; the second metal layer is a source and drain metal layer.

2. The display panel of claim 1, wherein the first direction is perpendicular to the second direction; the first metal line and the second metal line form a mesh-like metal line.

3. The display panel of claim 1, wherein a first hole is disposed in the first insulating layer; the first metal layer is electrically connected to the second metal layer through the first hole.

4. The display panel of claim 1, wherein the first metal line and the second metal line are arranged in a gap between the adjacent pixel units.

5. The display panel of claim 1, wherein the display panel comprises a display area and a non-display area; the non-display area is disposed at a periphery of the display area;
   the first metal layer is located in the display area; the peripheral metal line is located in the non-display area.

6. The display panel of claim 5, wherein the peripheral metal line surrounds three or more sides of the display area.

7. The display panel of claim 1, wherein the first direction is not parallel to the second direction.

8. A display device, comprising a display panel and a frame, the display panel comprising:
   a substrate;
   a first metal layer, arranged on the substrate, wherein the first metal layer comprises a first metal line and a second metal line; the first metal layer is spaced apart along a first direction; the second metal line is spaced apart along a second direction; the first metal line and the second metal line are connected at an intersection;
   a first insulating layer, disposed on the first metal layer;
   a second metal layer, disposed on the first insulating layer, wherein the second metal layer comprises a peripheral metal line electrically connected to the first metal line and the second metal line; and
   a pixel unit;
   wherein the first metal line and the second metal line are connected to the pixel unit and configured to supply the pixel unit with a signal voltage; wherein the first metal layer further comprises a signal routing; one or more of the first metal line and the second metal line are connected with the signal routing at the intersection with a bridge; wherein two terminals of the bridge are connected to a second hole of the first insulating layer, respectively; the second metal layer is electrically connected to the first metal line and the second metal line through the second hole; and wherein the first metal layer is a second gate metal layer; the first insulating layer is a second gate insulating layer; the second metal layer is a source and drain metal layer.

9. The display device of claim 8, wherein the first direction is perpendicular to the second direction; the first metal line and the second metal line form a mesh-like metal line.

10. The display device of claim 8, wherein a first hole is disposed in the first insulating layer; the first metal layer is electrically connected to the second metal layer through the first hole.

11. The display device of claim 8, wherein the first metal line and the second metal line are arranged in a gap between the adjacent pixel units.

12. The display device of claim 8, wherein the display panel comprises a display area and a non-display area; the non-display area is disposed at a periphery of the display area;
   the first metal layer is located in the display area; the peripheral metal line is located in the non-display area.

13. The display device of claim 12, wherein the peripheral metal line surrounds three or more sides of the display area.

14. The display device of claim 8, wherein the first direction is not parallel to the second direction.

* * * * *

UNITED STATES PATENT AND TRADEMARK OFFICE
CERTIFICATE OF CORRECTION

PATENT NO. : 10,923,554 B2
APPLICATION NO. : 16/493307
DATED : February 16, 2021
INVENTOR(S) : Caiqin Chen et al.

Page 1 of 1

It is certified that error appears in the above-identified patent and that said Letters Patent is hereby corrected as shown below:

On the Title Page

Insert the following:
-- (30) *Foreign Application Priority Data*
Dec. 18, 2018 (CN).................... 201811546762.6 --

Signed and Sealed this
Twenty-second Day of June, 2021

Drew Hirshfeld
*Performing the Functions and Duties of the
Under Secretary of Commerce for Intellectual Property and
Director of the United States Patent and Trademark Office*